United States Patent
Cheng et al.

(10) Patent No.: US 9,653,477 B2
(45) Date of Patent: May 16, 2017

(54) SINGLE-CHIP FIELD EFFECT TRANSISTOR (FET) SWITCH WITH SILICON GERMANIUM (SIGE) POWER AMPLIFIER AND METHODS OF FORMING

(71) Applicant: International Business Machines Corporation, Armonk, NY (US)

(72) Inventors: Peng Cheng, Greensboro, NC (US);
James S. Dunn, Jericho, VT (US);
Blaine J. Gross, Essex Junction, VT (US); Qizhi Liu, Lexington, MA (US);
James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 14/147,186

(22) Filed: Jan. 3, 2014

(65) Prior Publication Data

US 2015/0194416 A1 Jul. 9, 2015

(51) Int. Cl.
*H01L 21/336* (2006.01)
*H01L 27/12* (2006.01)
(Continued)

(52) U.S. Cl.
CPC ...... *H01L 27/1203* (2013.01); *H01L 21/3081* (2013.01); *H01L 27/0207* (2013.01);
(Continued)

(58) Field of Classification Search
CPC ......... H01L 21/76264; H01L 21/76283; H01L 29/0653
See application file for complete search history.

(56) References Cited

U.S. PATENT DOCUMENTS 4,814,287 A * 3/1989 Takemoto ............. H01L 21/743
257/E21.538
5,027,185 A 6/1991 Liauh
(Continued)

FOREIGN PATENT DOCUMENTS

| CN | 202856719 U | 4/2013 |
|----|-------------|--------|
| DE | 10145699 A1 | 4/2003 |

OTHER PUBLICATIONS

US 7,937,062, 05/2011, Burgener et al. (withdrawn)
(Continued)

*Primary Examiner* — Meiya Li
*Assistant Examiner* — Peter M Albrecht
(74) *Attorney, Agent, or Firm* — Michael J. LeStrange; Hoffman Warnick LLC

(57) ABSTRACT

Various embodiments include field effect transistors (FETs) and methods of forming such FETs. One method includes: forming a first set of openings in a precursor structure having: a silicon substrate having a crystal direction, the silicon substrate substantially abutted by a first oxide; a silicon germanium (SiGe) layer overlying the silicon substrate; a silicon layer overlying the SiGe layer; a second oxide overlying the silicon layer; and a sacrificial layer overlying the second oxide, wherein the first set of openings each expose the silicon substrate; undercut etching the silicon substrate in a direction perpendicular to the crystal direction of the silicon substrate to form a trench corresponding with each of the first set of openings; passivating exposed surfaces of at least one of the SiGe layer or the silicon layer in the first set of openings; and at least partially filling each trench with a dielectric.

14 Claims, 12 Drawing Sheets

(51) Int. Cl.
   *H01L 29/66* (2006.01)
   *H01L 29/78* (2006.01)
   *H01L 27/02* (2006.01)
   *H01L 29/06* (2006.01)
   *H01L 29/165* (2006.01)
   *H01L 29/45* (2006.01)
   *H01L 21/308* (2006.01)
   *H01L 27/088* (2006.01)

(52) U.S. Cl.
   CPC ...... *H01L 27/1207* (2013.01); *H01L 29/0649* (2013.01); *H01L 29/165* (2013.01); *H01L 29/456* (2013.01); *H01L 29/66477* (2013.01); *H01L 29/78* (2013.01); *H01L 29/7842* (2013.01); *H01L 27/088* (2013.01)

(56) References Cited

U.S. PATENT DOCUMENTS

| | | | | |
|---|---|---|---|---|
| 5,972,758 A * | 10/1999 | Liang | .................... | H01L 21/762 257/E21.433 |
| 6,117,711 A * | 9/2000 | Wu | ........................ | B82Y 10/00 257/E21.564 |
| 6,448,115 B1 * | 9/2002 | Bae | ................... | H01L 21/76264 257/E21.564 |
| 6,787,423 B1 * | 9/2004 | Xiang | ............... | H01L 21/76232 257/E21.549 |
| 7,045,468 B2 * | 5/2006 | Liang | ................ | H01L 21/76232 257/E21.549 |
| 7,515,879 B2 | 4/2009 | Okabe et al. | | |
| 7,696,034 B2 | 4/2010 | Geiss et al. | | |
| 8,134,209 B2 | 3/2012 | Yagishita et al. | | |
| 8,299,544 B2 | 10/2012 | Abou-Khalil et al. | | |
| 8,395,217 B1 * | 3/2013 | Cheng | .................... | H01L 21/84 257/350 |
| 8,437,585 B2 * | 5/2013 | Na | ..................... | G02B 6/12002 216/24 |
| 9,059,252 B1 * | 6/2015 | Liu | .................... | H01L 21/7682 |
| 2005/0029619 A1 * | 2/2005 | Forbes | ............. | H01L 21/26506 257/516 |
| 2005/0139952 A1 * | 6/2005 | Koh | .................. | H01L 21/76227 257/510 |
| 2005/0245043 A1 * | 11/2005 | Martin | .................. | H01L 21/764 438/424 |
| 2008/0217653 A1 * | 9/2008 | Sonsky | ............. | H01L 21/76264 257/190 |
| 2008/0317423 A1 * | 12/2008 | Stepanov | ............... | G02B 6/122 385/132 |
| 2009/0020851 A1 * | 1/2009 | Liu | .................... | H01L 29/41708 257/565 |
| 2009/0026524 A1 | 1/2009 | Kreupl et al. | | |
| 2009/0072351 A1 | 3/2009 | Maunier-Beillard et al. | | |
| 2012/0018806 A1 | 1/2012 | Furukawa et al. | | |
| 2012/0038024 A1 * | 2/2012 | Botula | .............. | H01L 21/76289 257/510 |
| 2012/0049318 A1 * | 3/2012 | Kawamata | ........ | H01L 21/76232 257/508 |
| 2012/0146152 A1 * | 6/2012 | Dove | ...................... | H01L 29/78 257/368 |
| 2012/0252384 A1 | 10/2012 | Burgener et al. | | |
| 2012/0292700 A1 | 11/2012 | Khakifirooz et al. | | |
| 2013/0115895 A1 | 5/2013 | Crandall | | |
| 2013/0320459 A1 * | 12/2013 | Shue | .................. | H01L 21/76283 257/392 |
| 2014/0291767 A1 * | 10/2014 | Lee | ................... | H01L 21/76229 257/368 |

OTHER PUBLICATIONS

Liu, J. L. et al., "A method for fabricating silicon quantum wires based on SiGe/Si heterostructure", Applied Physics Letters, vol. 68, No. 3, pp. 352-354, Jan. 15, 1996.*

Unknown, "Motivation for RF Integration". Fujitsu White Paper, www.fujitsu.com/downloads/MICRO/fma/formpdf/sms_rfcmos.pdf.

Office Action for U.S. Appl. No. 14/834,696, dated Dec. 2, 2015, 20 pages.

Office Action for U.S. Appl. No. 14/834,696, dated Apr. 5, 2016, 23 Pages.

* cited by examiner

SINGLE-CHIP FIELD EFFECT TRANSISTOR (FET) SWITCH WITH SILICON GERMANIUM (SIGE) POWER AMPLIFIER AND METHODS OF FORMING

FIELD

The subject matter disclosed herein relates to integrated circuits. More particularly, the subject matter relates to silicon-on-insulator field effect transistor chips.

BACKGROUND

As devices relying upon integrated circuits (ICs) have increased in complexity and functionality, those devices have required ever more dynamic ICs to meet the demands of those device users. For example, as mobile telephone technology has advanced, the size of the mobile phone has been significantly reduced while its functionality has significantly increased. These changes have required greater versatility from the ICs in mobile phones, as well as in other devices. In the case of the mobile phone, advances in these devices have required use of a single antenna as both a transmitter and receiver. The circuitry used in these antenna devices must therefore be able to switch very quickly in order to provide reliable performance.

Silicon-on-insulator (SOI) substrates have been used to build circuits capable of switching at these fast speeds. However, SOI substrates can be expensive to procure, making them less practicable for use.

BRIEF DESCRIPTION

Various embodiments include field effect transistors (FETs) and methods of forming such FETs. One method includes: forming a first set of openings in a precursor structure having: a silicon substrate having a crystal direction, the silicon substrate substantially surrounded by a first oxide; a silicon germanium (SiGe) layer overlying the silicon substrate and the first oxide; a silicon layer overlying the SiGe layer; a second oxide overlying the silicon layer; and a sacrificial layer overlying the second oxide, wherein the first set of openings each expose the silicon substrate; undercut etching the silicon substrate in a direction perpendicular to the crystal direction of the silicon substrate to form a trench corresponding with each of the first set of openings; passivating exposed surfaces of at least one of the SiGe layer or the silicon layer in the first set of openings; and at least partially filling each trench with a dielectric.

A first aspect includes a method including: forming a first set of openings in a precursor structure having: a silicon substrate having a crystal direction, the silicon substrate substantially surrounded by a first oxide; a silicon germanium (SiGe) layer overlying the silicon substrate and the first oxide; a silicon layer overlying the SiGe layer; a second oxide overlying the silicon layer; and a sacrificial layer overlying the second oxide, wherein the first set of openings each expose the silicon substrate; undercut etching the silicon substrate in a direction perpendicular to the crystal direction of the silicon substrate to form a trench corresponding with each of the first set of openings; passivating exposed surfaces of at least one of the SiGe layer or the silicon layer in the first set of openings; and at least partially filling each trench with a dielectric.

A second aspect includes a method including: forming a first set of openings in a precursor structure having: a silicon substrate having a crystal direction, the silicon substrate substantially surrounded by a first oxide; a silicon germanium (SiGe) layer overlying the silicon substrate and the first oxide; a silicon layer overlying the SiGe layer; a second oxide overlying the silicon layer; and a sacrificial layer overlying the second oxide, wherein the first set of openings each expose the silicon substrate; undercut etching the silicon substrate in a direction perpendicular to the crystal direction of the silicon substrate to form a trench corresponding with each of the first set of openings; passivating exposed surfaces of at least one of the SiGe layer or the silicon layer in the first set of openings; at least partially filling each trench with a dielectric to form an air gap within the trench, the air gap surrounded by the dielectric; and selectively etching the sacrificial layer to expose the second oxide layer.

A third aspect includes a field effect transistor having: a silicon substrate including a set of trenches; a first oxide substantially surrounding the silicon substrate; a silicon germanium (SiGe) layer overlying the silicon substrate and the first oxide; a silicon layer overlying the SiGe layer; a second oxide overlying the silicon layer, wherein the silicon layer includes a plurality of salicide regions; a gate structure overlying the second oxide between adjacent salicide regions; and a first contact contacting the gate structure; a second contact contacting one of the salicide regions; a third oxide partially filling the set of trenches and extending above the silicon layer overlying the SiGe layer; and an air gap in each of the set of trenches, the air gap surrounded by the third oxide.

A fourth aspect includes an integrated circuit (IC) layout having: a plurality of cells including at least one of a switching chip or a power amplifier chip, wherein the at least one of the switching chip or the power amplifier chip includes a field effect transistor (FET) structure having: a silicon substrate including a set of trenches; a first oxide abutting the silicon substrate; a silicon germanium (SiGe) layer overlying the silicon substrate; a silicon layer overlying the SiGe layer; a second oxide overlying the silicon layer, wherein the silicon layer includes a plurality of salicide regions; a gate structure overlying the second oxide between adjacent salicide regions; and a first contact contacting the gate structure; a second contact contacting one of the salicide regions; a third oxide partially filling the set of trenches and extending above the silicon layer overlying the SiGe layer; and an air gap in each of the set of trenches, the air gap surrounded by the third oxide.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 11 also shows a FET structure resulting from the processes described with reference to FIGS. 1-11.

Figure 1:
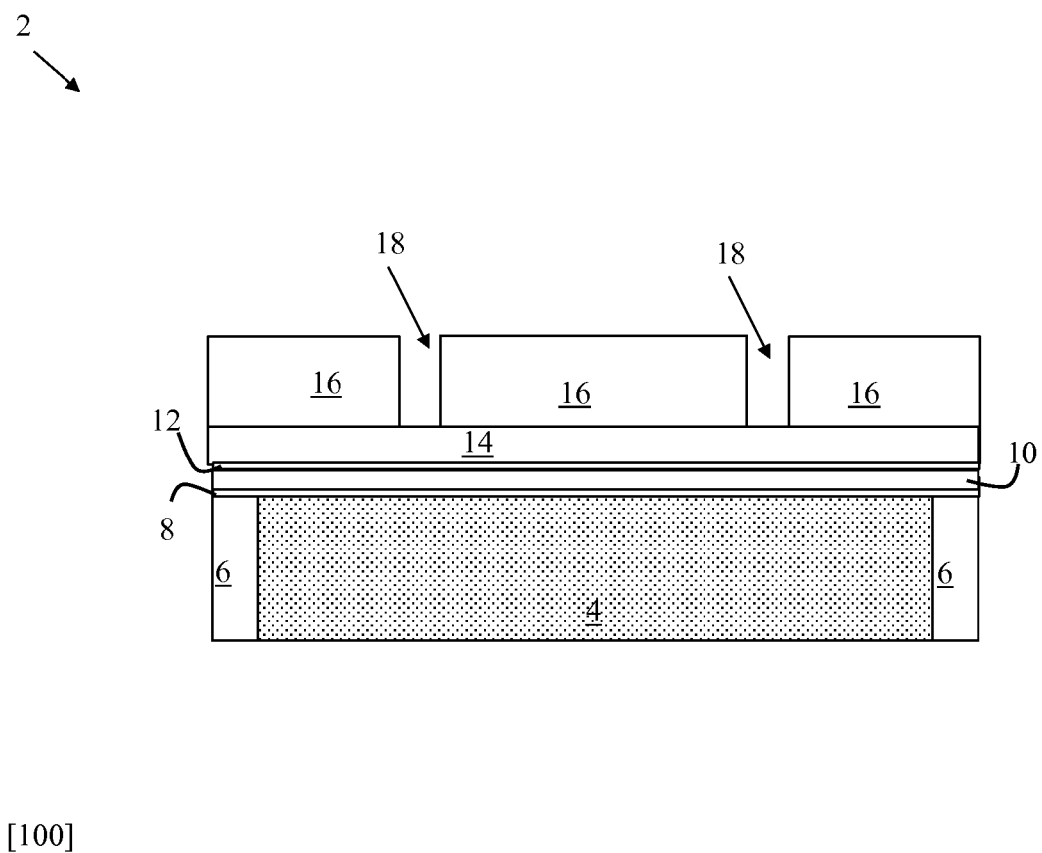
FIGS. 1-11 show cross-sectional schematic views of processes in forming a field effect transistor (FET) structure according to various embodiments.
Figure 1:
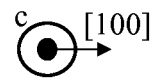

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuits. More particularly, the subject matter relates to silicon-on-insulator field effect transistor chips on bulk Si substrates, and methods of forming such chips.

As described herein, due to increased complexity and functionality of devices relying upon integrated circuits (ICs), those devices have required ever more dynamic ICs to meet the demands of those device users. For example, as mobile telephone technology has advanced, the size of the mobile phone has been significantly reduced while its functionality has significantly increased. These changes have required greater versatility from the ICs in mobile phones, as well as in other devices. In the case of the mobile phone, advances in these devices have required use of a single antenna as both a transmitter and receiver. The circuitry used in these antenna devices must therefore be able to switch very quickly in order to provide reliable performance.

Silicon-on-insulator (SOI) substrates have been used to build circuits capable of switching at these fast speeds. However, SOI substrates can be expensive to procure, making them less practicable for use.

Various embodiments are directed toward IC structures and methods of forming such structures. These structures can include some of the functionality of SOI substrates, but can be formed from less expensive substrates, e.g., bulk silicon where buried oxide (or, BOX) is built in predetermined regions on substrates. Various particular embodiments are directed toward a silicon germanium (SiGe) hetero junction bipolar transistor (HBT) formed on a bulk silicon (Si) substrate.

Various aspects include a method including: forming a first set of openings in a precursor structure having: a silicon substrate having a crystal direction, the silicon substrate abutted by a first oxide; a silicon germanium (SiGe) layer overlying the silicon substrate; a silicon layer overlying the SiGe layer; a second oxide overlying the silicon layer; and a sacrificial layer overlying the second oxide, wherein the first set of openings each expose the silicon substrate; passivating exposed surfaces of at least one of the SiGe layer or the silicon layer in the first set of openings; undercut etching the silicon substrate in a direction perpendicular to the crystal direction of the silicon substrate to form a trench corresponding with each of the first set of openings; passivating exposed surfaces of at least one of the SiGe layer or the silicon layer in the first set of openings; and partially filling each trench with a dielectric.

Various additional aspects include a method including: forming a first set of openings in a precursor structure having: a silicon substrate having a crystal direction, the silicon substrate substantially abutted by a first oxide; a silicon germanium (SiGe) layer overlying the silicon substrate; a silicon layer overlying the SiGe layer; a second oxide overlying the silicon layer; and a sacrificial layer overlying the second oxide, wherein the first set of openings each expose the silicon substrate; undercut etching the silicon substrate in a direction perpendicular to the crystal direction of the silicon substrate to form a trench corresponding with each of the first set of openings; passivating exposed surfaces of at least one of the SiGe layer or the silicon layer in the first set of openings; partially filling each trench with a dielectric to form an air gap within the trench, the air gap surrounded by the dielectric; and selectively etching the sacrificial layer to expose the second oxide layer.

Other aspects include a field effect transistor having: a silicon substrate including a set of trenches; a first oxide abutting the silicon substrate; a silicon germanium (SiGe) layer overlying the silicon substrate; a silicon layer overlying the SiGe layer; a second oxide overlying the silicon layer, wherein the silicon layer includes a plurality of salicide regions; a gate structure overlying the second oxide between adjacent salicide regions; and a first contact contacting the gate structure; a second contact contacting one of the salicide regions; a third oxide partially filling the set of trenches and extending above the silicon layer overlying the SiGe layer; and an air gap in each of the set of trenches, the air gap surrounded by the third oxide.

Various other embodiments include: an integrated circuit (IC) layout having: a plurality of cells including at least one of a switching chip or a power amplifier chip, wherein the at least one of the switching chip or the power amplifier chip includes a field effect transistor (FET) structure having: a silicon substrate including a set of trenches; a first oxide abutting the silicon substrate; a silicon germanium (SiGe) layer overlying the silicon substrate; a silicon layer overlying the SiGe layer; a second oxide overlying the silicon layer, wherein the silicon layer includes a plurality of salicide regions; a gate structure overlying the second oxide between adjacent salicide regions; and a first contact contacting the gate structure; a second contact contacting one of the salicide regions; a third oxide partially filling the set of trenches and extending above the silicon layer overlying the SiGe layer; and an air gap in each of the set of trenches, the air gap surrounded by the third oxide.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

FIGS. 1-10 show cross-sectional views of integrated circuit (IC) structures which illustrate processes in various methods of forming a field effect transistor (FET) according to various embodiments. FIG. 1 illustrates an optional pre-process in forming a first set of openings in a precursor structure 2. As shown, the precursor structure can include: a silicon substrate 4 having a crystal direction (c), directed into the page. The silicon substrate 4 can be formed of a bulk silicon, as described herein. Abutting (contacting on a side) the silicon substrate 4 is a first oxide 6, e.g., silicon dioxide $SiO_2$. Overlying the silicon substrate 4 is a silicon germanium (SiGe) layer 8, which may have been blanket deposited, epitaxially grown, etc., over the silicon substrate 4. A silicon layer 10 overlies the SiGe layer 8, and may have been blanket deposited, epitaxially grown, etc. over the SiGe layer 8. A second oxide 12 is formed over the silicon layer 10. The second oxide 12 can be formed of a similar or distinct oxide as the first oxide 6, e.g., $SiO_2$ or any other oxide known in the art. A sacrificial layer 14 is formed over the second oxide 12, and the sacrificial layer 14 may be blanket deposited over the second oxide 12. In various embodiments, the sacrificial layer 14 includes at least one of amorphous silicon (a-Si), SiGe, Ge and/or silicon nitride (SiN). It is understood that in various embodiments, the first oxide 6 can include a trench isolation oxide (e.g., an shallow trench isolation (STI) region), and in various embodiments the first oxide 6 can abut and surround one or more of the silicon substrate 4, SiGe layer 8, silicon layer 10, second oxide 12 and the sacrificial layer 14.

The pre-process illustrated in FIG. 1 can include forming a resist layer 16 over the sacrificial layer 14 including a set of openings 18 (two shown) exposing the sacrificial layer 14. In various embodiments, the resist layer 16 is deposited over the sacrificial layer 14, and subsequently exposed using a photo-mask such as a nickel-based (NiT) mask in a photo-lithography process, known to those skilled in the art. Exposing the resist layer 16 forms a pattern (including openings 18).

Following formation of the resist layer 16 over the sacrificial layer 14, the process can further include forming a first set of openings 20 (two shown) in the precursor structure 2, the openings 20 each exposing the silicon substrate 4. In some particular embodiments, the forming of the first set of openings 20 includes etching through the sacrificial layer 14, the second oxide layer 12, the silicon layer 10 and the SiGe layer 8 to expose the silicon substrate 4. In some embodiments, forming of the openings 20 is performed using a reactive ion etch (RIE) process, the details of which are known to those having skill in the art. In various embodiments, the etching includes performing a non-selective SiGe/oxide/Si (SOS) etch to expose the silicon substrate 4.

Figure 2:
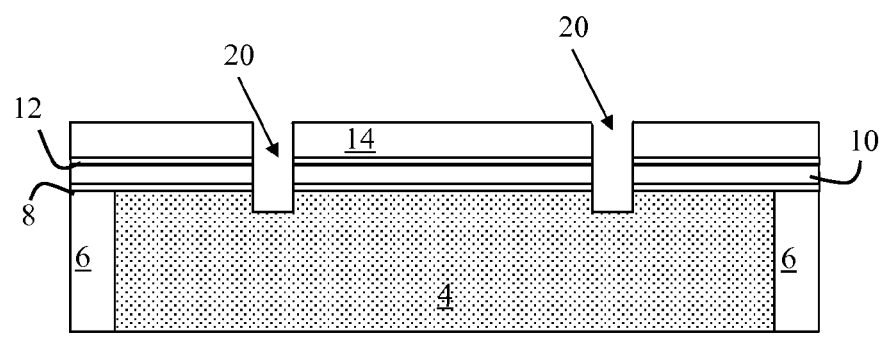
Figure 2:

FIG. 2 illustrates an additional process of stripping (removing) the resist layer 16 after forming the openings 20 each exposing the silicon substrate 4.

Figure 3:
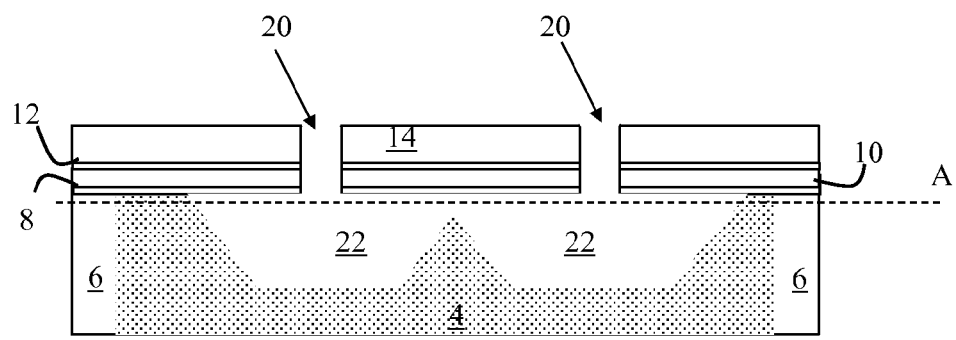
Figure 3:
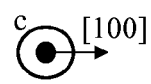

FIG. 3 illustrates another process of undercut etching the silicon substrate 4 in a direction perpendicular ([100], or its equivalent directions <100>) to the crystal direction (c) of the silicon substrate 4 to form a trench 22 corresponding with each of the first set of openings 20. In some embodiments, prior to the undercut etch, sidewalls of the openings 20 (e.g., sidewalls of one or more of SiGe layer 8, silicon layer 10, second oxide 12 and/or sacrificial layer 14) are protected by spacers that are formed by a blanket deposition and etch process from the undercut etch chemistry. In some embodiments, the undercut etch removes the silicon substrate 4 exposing portions of the underside of the SiGe layer 8. It is understood that the portion of the structure that appears suspended in this view is actually anchored to the silicon substrate 4 along the crystal direction (c), not visible in this cross-sectional depiction. In various embodiments, the undercut etching is performed using a wet chemical etch, e.g., ammonia hydroxide-based etching or potassium hydroxide-based etching. These wet chemical etches are crystalline-dependent, meaning that these etches have different speeds in different directions. The depth of the first set of openings 20 formed via the undercut etch described with reference to FIG. 3 is dictated by both: a) the depth of the undercut etch, as well as b) the width of the undercut etch (with respect to the silicon substrate 4).

Figure 4:
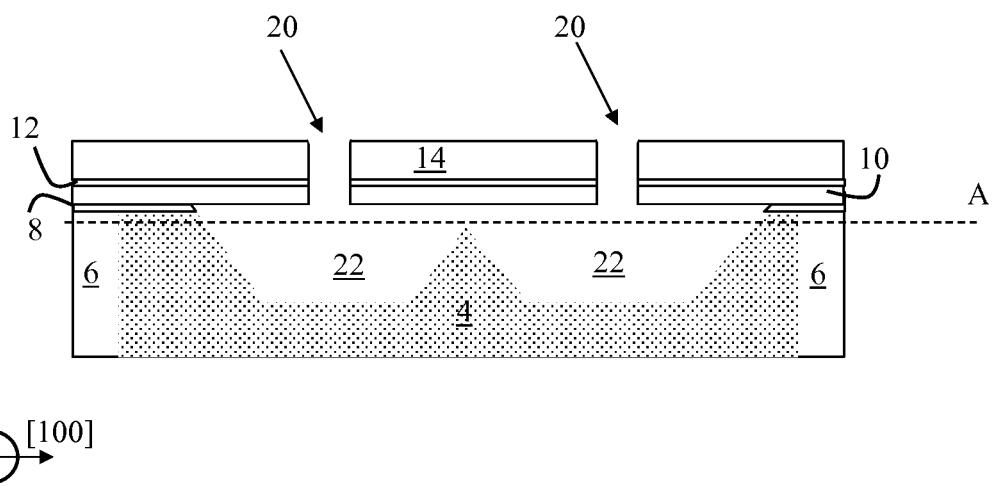

FIG. 4 illustrates an optional process of selectively removing a portion of the SiGe layer 8 underlying the silicon layer 10 within the trench 22. In some cases, this optional process can be performed using a selective etch, e.g., an isotropic reactive ion etch (RIE), a dry etch or a chemical etch, which etches the SiGe 8 to the silicon layer 10 within the trench 22.

Figure 5:
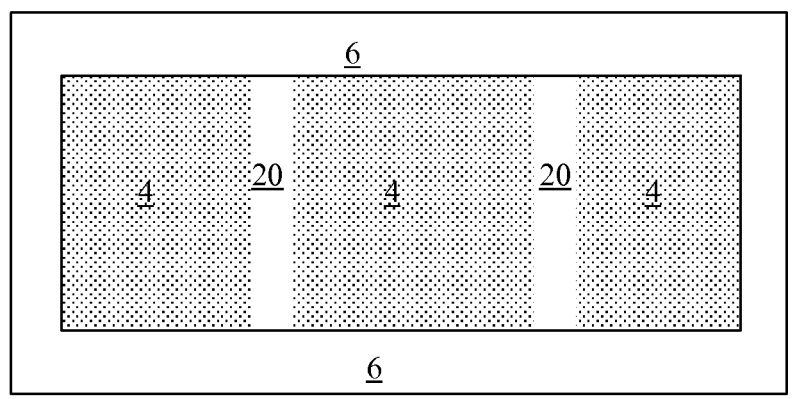
Figure 6:
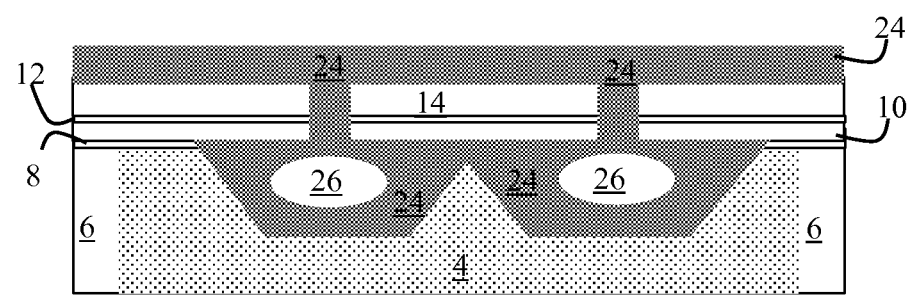
Figure 6:
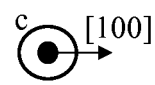

FIG. 5 shows a top cross-sectional view of a portion of the structure shown in FIG. 3 and FIG. 4, cut along line (A). As shown, in various embodiments, the first oxide 6 can include an STI oxide, and can substantially surround the silicon substrate 4. In various embodiments, the first oxide 6 (e.g., STI oxide) can physically support the center region of the silicon substrate 4 (as well as overlying layers), that is separated from other portions of the silicon substrate 4 by openings 20 (and trenches 22, shown in FIGS. 3-4). The first oxide 6 can support this center region of the silicon substrate 4 at least until subsequent filling of the trenches 22.

(FIG. 6) illustrates additional processes including: a) passivating at least one of the exposed surfaces of the silicon layer 10 within the openings 20 or the exposed surfaces of the SiGe layer 8 in the openings 20; and b) at least partially filling the trenches 22 (and openings 20) with a dielectric (e.g., a third oxide) 24. In various embodiments, passivating the exposed surfaces of the silicon layer 10 and/or the exposed surfaces of the SiGe layer 8 within the opening(s) 20 includes performing a rapid thermal oxidation (RTO) process or a dry oxidation process on the silicon layer 10 and/or the SiGe layer 8. The process of at least partially filling the trenches 22 with the dielectric 24 can include conformally depositing a silicon dioxide film, e.g., via low-pressure chemical vapor phase deposition (LPCVD) with tetraethoxysilane (LP-TEOS) along the sidewalls and other exposed surfaces of the silicon substrate 4 and along the underlying surfaces of the silicon layer 10 (or SiGe 8 in some embodiments). In various embodiments, the dielectric (e.g., silicon dioxide) 24 is deposited to fill the openings 20, and in some cases, the dielectric 24 completely fills the openings 20 to extend above the SiGe layer 8. According to various embodiments, the dielectric 24 may only partially fill the trench 22, such that it leaves an air gap 26 within the trench 22 surrounded by the dielectric 24. That is, the dielectric 24 is formed conformally, such that it adheres to surfaces and "builds" inward, leaving the air gap 26.

Figure 7:
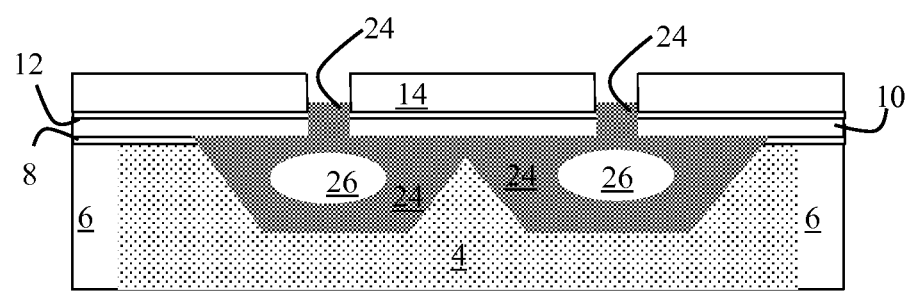
Figure 7:
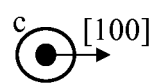

FIG. 7 illustrates another process including etching the dielectric 24 back below the upper surface of the sacrificial layer 14, e.g., via a conventional end-pointed etch. In various embodiments, the dielectric 24 is etched to a level above the upper surface of the SiGe layer 8 and below the upper surface of the sacrificial layer 14 within the opening 20.

Figure 8:
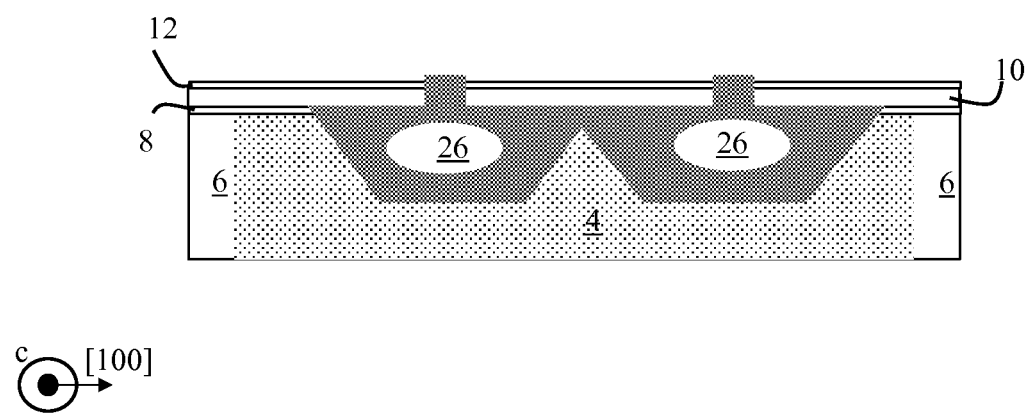

FIG. 8 illustrates removing the sacrificial layer 14, e.g., via conventional etching. The sacrificial layer 14 can be selectively etched back to expose the second oxide 12.

Figure 9:
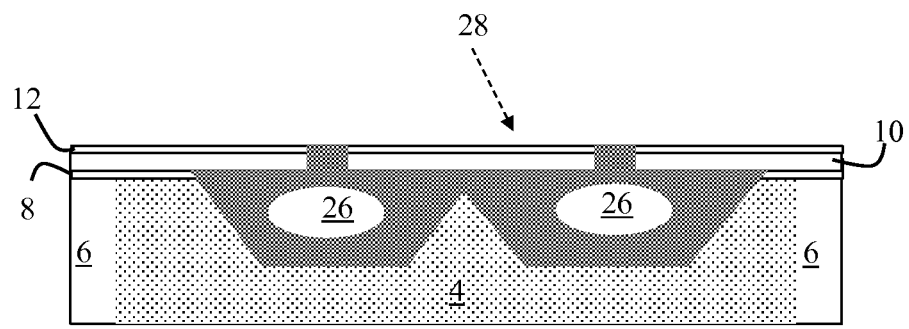
Figure 9:
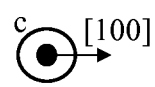

FIG. 9 illustrates an optional process of stripping the second oxide 12 to expose the silicon layer 10 and re-growing a gate oxide 28 over the silicon layer 10. The stripping in this process can be performed via an etching process, e.g., a dry or wet etch, and the re-growing of the gate oxide 28 can be performed by thermally growing the gate oxide.

Figure 10:
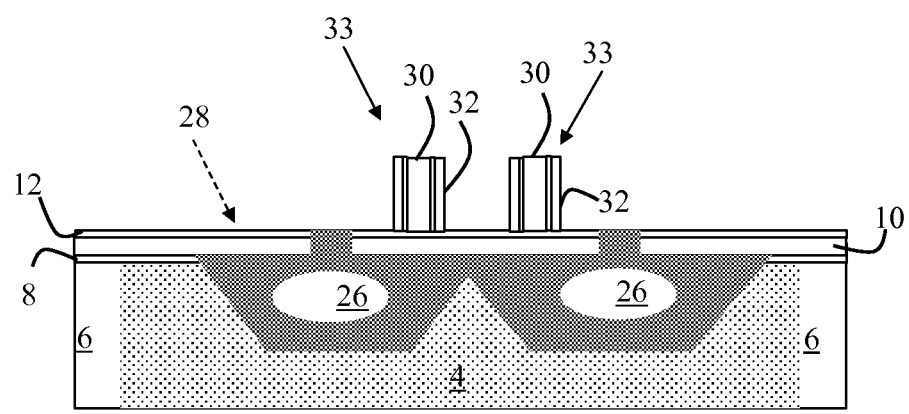
Figure 10:
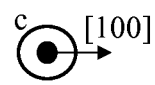

FIG. 10 illustrates a process of forming a gate 30 and spacers 32 over the second oxide layer 12 (or the re-grown gate oxide 28, if optional process in FIG. 9 is performed). This includes conventional processes of depositing a gate polysilicon, forming the gate by photolithography and etching, followed by forming insulators (spacers 32) to form an active device (e.g., a FET).

Figure 11:
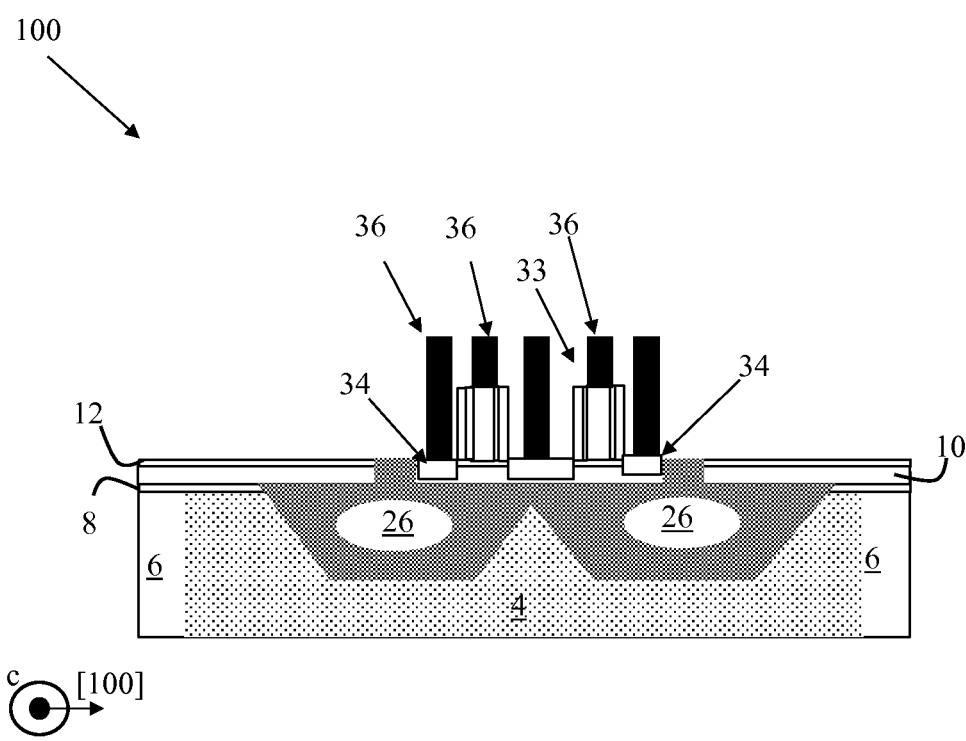

In some cases, as shown in FIG. 11, the process can include forming salicide regions 34 in the silicon layer 10 (or the re-grown gate oxide 28, if optional process in FIG. 9 is performed) and on top of gates to form active source, drain, and gate regions for field effect transistors (FETs). Salicide regions 34 can be formed according to various techniques known in the art. Contacts 36 can then be formed to contact the salicide regions 34 and the gate(s) 30. Contacts 36 can be formed via any conventional deposition/masking/etch techniques known in the art.

As shown, FIG. 11 displays one embodiment of a field effect transistor (FET) 100 according to various embodiments. The FET 100 can include a silicon substrate 4 including a set of trenches 22 (now filled and shown in phantom). Substantially surrounding the silicon substrate 4 is the first oxide 6. The silicon germanium (SiGe) layer 8 overlies the silicon substrate 4. The silicon layer 10 overlies the SiGe layer 8 and includes a plurality of the salicide regions 34. The gate structure 33 (including gate 30 and spacers 32) overlies the second oxide 12 between adjacent salicide regions 34, and contacts 36 contact the gate structure 33 (at the gate 30) and at least one of the salicide regions 34. As shown, the dielectric 24 (e.g., third oxide layer) partially fills the set of trenches 22 and extends above the silicon layer 10 overlying the SiGe layer 8. Air gaps 26 are contained within the dielectric 24 and surrounded by the dielectric 24 (e.g., third oxide).

The FET 100 of FIG. 11 can provide enhanced switching capability when compared with conventional bulk-silicon FET structures. In some cases, the FET 100 can provide for high-speed switching capability conventionally found only in silicon-on-insulator based structures.

In various embodiments, the FET 100 of FIG. 11, formed according to various embodiments herein, can include a complementary-metal-oxide semiconductor (CMOS) FET.

According to various additional embodiments, the FET 100 of FIG. 11 can be formed in a reversed order as shown and described herein. That is, according to these various other embodiments, the gate structures 33 can be formed prior to the dielectric 24/air gap(s) 26, by masking the gate structures 33 and subsequently performing the processes of masking/etching, undercut etching to form trenches 22, and partially filing trenches 22 to form air gaps 26. In various embodiments, the processes shown and described herein can be used to form power amplifier devices, e.g., hetero junction bipolar transistor power amplifier (HBT PA) devices. In these cases, the HBT PA devices can include SiGe as a substrate material, with embedded trenches (e.g., trenches 22) and air gaps (e.g., air gaps 26) as shown and described herein with respect to the FET structures (e.g., FET 100).

As described herein, according to various embodiments, the FET 100, and similarly formed FETs can allow for formation of trenches 22 with a direction that is either perpendicular to the direction of the gate structure 33, or parallel to the direction of the gate structure 33. This can allow for effective stacking of a plurality of FETs (e.g., FETs 100). More particularly, in some embodiments, the set of trenches 22 is oriented in a direction perpendicular to a direction of the gate structure 33, and the FET 100 is stackable with another substantially similar FET structure (e.g., a substantially identical FET 100) having a set of trenches 22 oriented in a direction perpendicular to a direction of a gate structure 33 in the similar FET structure 100.

Figure 12:
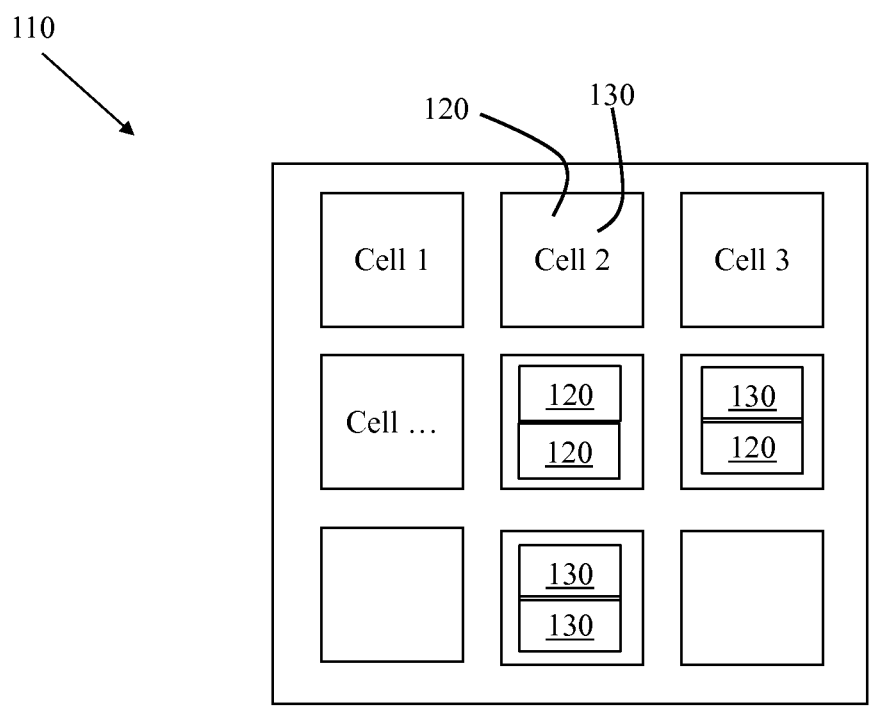
FIG. 12 shows a schematic top view of an integrated circuit (IC) layout according to various embodiments.

Various additional embodiments allow for stacking at least one power amplifier (PA) chip over a switching chip. FIG. 12 shows a schematic top view of an integrated circuit (IC) layout 110 according to various embodiments. The IC layout 110 can include a plurality of cells (Cell 1, Cell 2, Cell 3, etc.). The cells can include a switching chip 120 and/or a power amplifier chip 130, at least one of which can include a FET structure (e.g., FET 100) and/or an HBT PA structure described herein. In various embodiments, switching chip 120 and each power amplifier chip 130 within the same cell (e.g., Cell 1, Cell 2, etc.) is capable of handling the same level of current. In various embodiments, each switching chip 120 in a unit cell (e.g., Cell 1, Cell 2, etc.) includes a FET 100, and all switching chips 120 in each cell (e.g., Cell 1, Cell 2, etc.) have the same number of stacked FETs 100.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A method comprising:
    forming a first set of openings in a precursor structure having:
        a silicon substrate having a crystal direction, the silicon substrate substantially abutted by a first oxide layer;
        a silicon germanium (SiGe) layer directly overlying the silicon substrate and the first oxide layer;
        a silicon layer overlying the SiGe layer;
        a second oxide layer overlying the silicon layer; and
        a sacrificial layer overlying the second oxide layer,
    wherein the first set of openings each exposes the silicon substrate;
    undercut etching the silicon substrate in a direction perpendicular to the crystal direction of the silicon substrate to form a set of trenches corresponding with the first set of openings, respectively;
    passivating exposed surfaces of at least one of the SiGe layer and the silicon layer in the first set of openings;
    at least partially filling each trench with a dielectric layer to form air gaps in the set of trenches, respectively, each of the air gaps being surrounded by the dielectric layer; and
    forming a gate over the second oxide layer,
    wherein the dielectric layer forms a joint portion between adjacent ones of the air gaps, the joint portion being jointly disposed in adjacent trenches of the set of trenches, and wherein the gate directly overlies the joint portion.

2. The method of claim 1, wherein the dielectric layer includes a third oxide layer.

3. The method of claim 1, further comprising removing the sacrificial layer.

4. The method of claim 3, wherein the removing of the sacrificial layer includes selectively etching the sacrificial layer to expose the second oxide layer.

5. The method of claim 4, further comprising forming spacers over the second oxide layer.

6. The method of claim 5, further comprising:
    forming salicide regions in the silicon layer; and
    forming contacts to the salicide regions and the gate.

7. The method of claim 5, wherein the forming of the gate and the spacers is performed prior to the forming of the first set of openings in the precursor structure.

8. The method of claim 1, further comprising removing the second oxide layer to expose the silicon layer on top of the SiGe layer.

9. The method of claim 8, further comprising re-growing a gate oxide over the exposed silicon layer on the top of the SiGe layer.

10. The method of claim 1, wherein the forming of the first set of openings includes forming a resist layer over the sacrificial layer and etching through the sacrificial layer, the second oxide layer, the silicon layer and the SiGe layer to expose the silicon substrate.

11. A method comprising:
    forming a first set of openings in a precursor structure having:
        a silicon substrate having a crystal direction, the silicon substrate substantially abutted by a first oxide layer;
        a silicon germanium (SiGe) layer directly overlying the silicon substrate and the first oxide layer;
        a silicon layer overlying the SiGe layer;
        a second oxide layer overlying the silicon layer; and
        a sacrificial layer overlying the second oxide layer,
    wherein the first set of openings each exposes the silicon substrate;
    undercut etching the silicon substrate in a direction perpendicular to the crystal direction of the silicon substrate to form a set of trenches corresponding with the first set of openings, respectively;
    performing a selective etch on the SiGe layer after the undercut etching to remove the SiGe layer along a bottom surface of the silicon layer within each trench;
    passivating exposed surfaces of at least one of the SiGe layer and the silicon layer in the first set of openings;
    at least partially filling each trench with a dielectric layer to form air gaps within the set of trenches, respectively, each of the air gaps being surrounded by the dielectric layer;
    selectively etching the sacrificial layer to expose the second oxide layer; and
    forming a gate over the second oxide layer,
    wherein the dielectric layer forms a joint portion between adjacent ones of the air gaps, the joint portion being jointly disposed in adjacent trenches of the set of trenches, and wherein the gate directly overlies the joint portion.

12. The method of claim 11, further comprising:
    forming spacers over the second oxide layer;
    forming salicide regions in the silicon layer; and
    forming contacts to the salicide regions and the gate.

13. The method of claim 11, wherein the forming of the first set of openings includes forming a resist layer over the sacrificial layer and etching through the sacrificial layer, the second oxide layer, the silicon layer and the SiGe layer to expose the silicon substrate.

14. The method of claim 1, further comprising performing a selective etch on the SiGe layer after the undercut etching to remove the SiGe layer along a bottom surface of the silicon layer within each trench.

* * * * *